United States Patent [19]

Heinz

[11] Patent Number: 4,904,754
[45] Date of Patent: Feb. 27, 1990

[54] HEAT-STABLE COPOLYCONDENSATE MOLDING MATERIALS

[75] Inventor: Gerhard Heinz, Weisenheim, Fed. Rep. of Germany

[73] Assignee: BASF Aktiengesellschaft, Ludwigshafen, Fed. Rep. of Germany

[21] Appl. No.: 242,161

[22] Filed: Sep. 9, 1988

Related U.S. Application Data

[62] Division of Ser. No. 36,446, Apr. 9, 1987, abandoned.

[30] Foreign Application Priority Data

Apr. 30, 1986 [DE] Fed. Rep. of Germany ....... 3614753

[51] Int. Cl.$^4$ .................. C08G 8/02; C08G 14/00
[52] U.S. Cl. .................... 528/171; 528/125; 528/126; 528/128; 528/219
[58] Field of Search ............... 528/171, 125, 126, 128, 528/219

[56] References Cited

U.S. PATENT DOCUMENTS 4,175,175 11/1979 Johnson et al. ............... 528/125
4,703,081 10/1987 Blackwell et al. ............ 524/592

Primary Examiner—John Kight
Assistant Examiner—M. L. Moore
Attorney, Agent, or Firm—Oblon, Spivak, McClelland, Maier & Neustadt

[57] ABSTRACT

Copolycondensate molding materials are obtainable by polycondensation of from 2 to 98 mol % of 2,2-di-(4'-hydroxyphenyl)-propane (A), from 2 to 98 mol % of 4,4'-dihydroxydiphenyl sulfone (B) and from 0 to 96 mol % of (C)

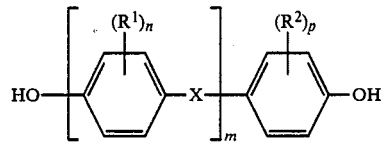

where $R^1$ and $R^2$ are each H, $C_1$–$C_6$-alkyl or $C_1$–$C_6$-alkoxy, X is a chemical bond, —S—, —O—, —CO—, $CR^3R^4$ (where $R^3$ and $R^4$ are different when n and p are each 0), or $SO_2$— (only when n or p is not 0), $R^3$ and $R^4$ are each H, $C_1$–$C_6$-alkyl, $C_1$–$C_6$-alkoxy, aryl or halogen-substituted alkyl of 1 to 4 carbon atoms, m is 0 or 1, and n and p are each 0, 1, 2, 3 or 4, with from 1 to 100 mol % of (D)

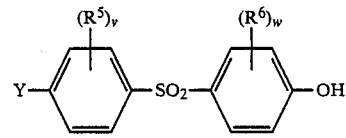

where $R^5$ and $R^6$ have the same meanings as $R^1$ and $R^2$, and v and w are each 0, 1, 2, 3 or 4, and from 0 to 99 mol % of (E)

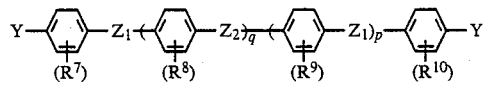

where $R^7$–$R^{10}$ are each Cl or F or have the same meanings as $R^1$ and $R^2$, q is 0 or 1, r, s, t and n are each 0, 1, 2, 3 or 4, $Z_1$ is —$SO_2$— or —CO— and $Z_2$ is —O—, —S—, —$SO_2$—, —CO— or a chemical bond, with the proviso that one or more of the components C and E are present and the molar ratio of B to the sum of A and C is not greater than 1.

19 Claims, No Drawings

HEAT-STABLE COPOLYCONDENSATE MOLDING MATERIALS

This is a division of application Ser. No. 036,446, filed Apr. 9, 1987 now abandoned.

SUMMARY OF THE INVENTION

The present invention relates to heat-stable copolycondensate molding materials which contain polyarylene sulfone and polyarylene ether sulfone units in random distribution and are obtainable by polycondensation of a mixture of (A) from 2 to 98 mol %, based on the sum of (A)–(C), of

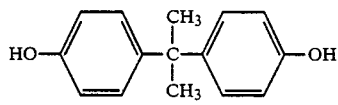

(B) from 2 to 98 mol %, based on the sum of (A)–(C), of

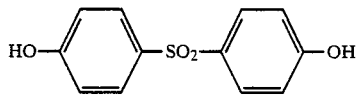

and
(C) from 0 to 96 mol %, based on the sum of (A)–(C), of

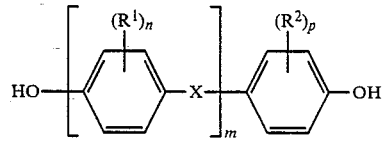

where X is a chemical bond or

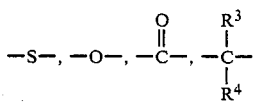

($R^3$ and $R^4$ are different when n and p are simultaneously 0) or

(only when n or p is not 0), $R^1$ and $R^2$ are each alkyl or alkoxy, each of 1 to 6 carbon atoms, $R^3$ and $R^4$ are each hydrogen, alkyl of 1 to 6 carbon atoms, aryl or halogen-substituted alkyl of 1 to 4 carbon atoms, m is 0 or 1 and n and p are 0, 1, 2, 3 or 4, with (D) from 1 to 100 mol %, based on the sum of (D) and (E), of

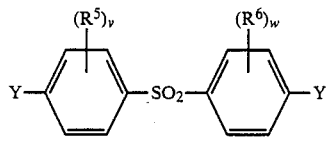

where $R^5$ and $R^6$ are each hydrogen or have the same meanings as $R^1$ and $R^2$, and v and w are each 0, 1, 2, 3 or 4, and (E) from 0 to 99 mol %, based on the sum of (D) and (E), of

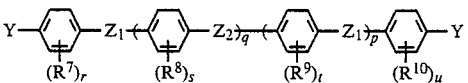

where Y is Cl or F, $Z_1$ is

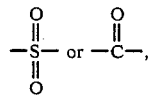

$Z_2$ is —O—, —S—,

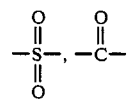

or a chemical bond, $R^7$, $R^8$, $R^9$ and $R^{10}$ are each hydrogen, Cl or F or may have the same meanings as $R^1$ and $R^2$, q and p are each 0 or 1 and r, s, t and u may each be an integer from 0 to 4, with the proviso that one or more of the components C and E are present and the molar ratio of B to the sum of A+C is not greater than 1.

The present invention furthermore relates to a process for the preparation of such copolycondensate molding materials and their use for the production of printed circuit boards and electrical plug connections, and to moldings which are obtainable from the novel copolycondensate molding materials as essential components.

DETAILED DESCRIPTION OF THE PREFERRED EMBODIMENTS

Polyethersulfones containing the general structural unit

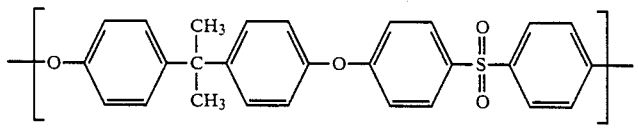

(frequently referred to, as below, simply as polysulfones) are characterized by very low water absorption and hence very good dimensional stability (of the moldings produced from them). However, the heat distortion resistance (which is frequently described in terms of the maximum temperature during continuous operation) is not sufficient for some applications, particularly in the case of printed circuit boards (also referred to as PCB's) produced from these materials.

Compared with polysulfones, polyethersulfones containing the general structural unit

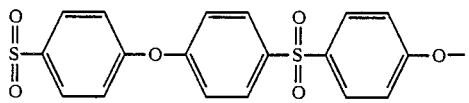

possess better heat distortion resistance, but their water absorption is substantially higher. The consequence of this is that moldings produced from polyethersulfones tend to swell and become distorted, which is undesirable when used in the electrical industry and electronics (production of printed circuit boards).

Mixtures of polysulfones and polyethersulfones exhibit a linear relationship between mixing ratio and water absorption, but the polysulfone component has an adverse effect on the heat distortion resistance. Moreover, because of the incompatibility of the two components, moldings produced from such mixtures are not transparent, and this is a substantial disadvantage.

US-A No. 4 175 175, EP-A 113 112 and EP-A 135 130 describe copolycondensates which are obtainable by condensation of mixture of 2,2-di-(4-hydroxyphenyl)-propane (bisphenol A) and 4,4'-dihydroxydiphenyl sulfone (bisphenol S) with 4,4'-dichlorodiphenyl sulfone (DCDPS).

EP-A 113 112 also describes copolycondensates of a mixture of dihydroxy compounds A, B and C and dihalogen compounds D. However, the molar ratio of B to A and C is always greater than 1, which has an adverse effect on the water absorption.

Although these copolycondensates have in general better properties than the polysulfones or polyethersulfones, the heat distortion resistance and the stress cracking resistance are still unsatisfactory. These copolycondensates can be used only to a very restricted extent for the production of printed circuit boards.

It is an object of the present invention to provide heat-stable copolycondensates which have a balanced property spectrum, ie. sufficient heat distortion resistance coupled with low water absorption and high stress cracking resistance, and are suitable for the production of circuit boards, in particular printed circuit boards.

We have found that this object is achieved, according to the invention, by the heat-stable copolycondensate molding materials defined at the outset.

Preferred copolycondensates of this type are mentioned in the subclaims and in the detailed description below.

The novel heat-stable copolycondensates are obtainable by polycondensation of a mixture of aromatic dihydroxy compounds A, B and, if required, C with aromatic dihalogen compounds D and, if required, E, and it is essential for one or more of the compounds C and E to be present.

The dihydroxy compound A is 2,2-di-(4-hydroxyphenyl)-propane, which is known as bisphenol A, and the dihydroxy compound B is 4,4'-dihydroxydiphenyl sulfone, which is also referred to as bisphenol S.

The dihydroxy compounds C are of the general formula

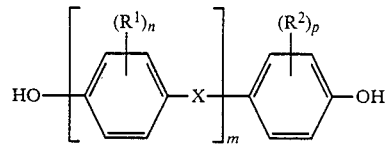

where X is not a chemical bond or

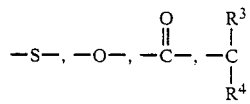

($R^3$ and $R^4$ are different when n and p are each 0) or

(when n or p is 0), $R^1$ and $R^2$ are each alkyl or alkoxy, each of 1 to 6 carbon atoms, $R^3$ and $R^4$ are each hydrogen, alkyl or alkoxy of 1 to 6 carbon atoms, aryl or halogen-substituted alkyl of 1 to 4 carbon atoms, m is 0 or 1, preferably 1, and n and p are each 0, 1, 2, 3 or 4.

$R^1$ and $R^2$ are each preferably alkyl of 1 to 4 carbon atoms, eg. methyl, ethyl, isopropyl, n-propyl or n-, iso- or tert-butyl or corresponding alkoxy groups. Methyl and ethyl are particularly preferred.

Preferred substituents $R^3$ and $R^4$ are $C_1$–$C_4$-alkyl groups, as described for $R^1$ and $R^2$, aryl or halogen-substituted alkyl, such as $CF_3$ and $CCl_3$, to mention but two examples.

m is 0 or 1, and is preferably 1 particularly when p is 0, ie. no substituents $R^2$ are present.

n and p may each be 0, 1, 2, 3 or 4, preferably 0, 1, 2 or 3.

A few examples of preferred dihydroxy compounds are listed below:

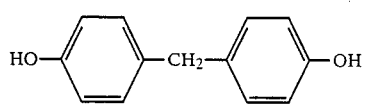 Di-(4-hydroxyphenyl)-methane

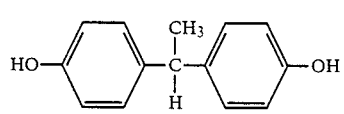 2,2-Di-(4-hydroxyphenyl)-ethane

| | |
|---|---|
| 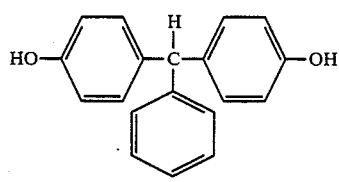 | 1-Phenyl-1,1-di-(4-hydroxyphenyl)-methane |
| 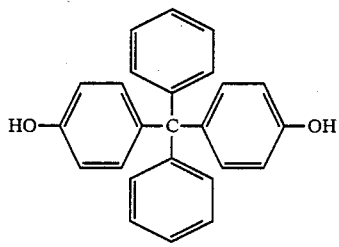 | Diphenyl-di-(4-hydroxyphenyl)-methane |
| 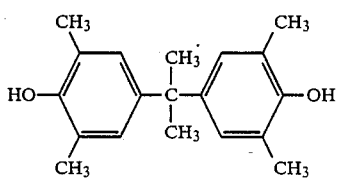 | Tetramethylbisphenol A |
| 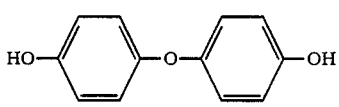 | 4,4'-Dihydroxydiphenyl ether |
| 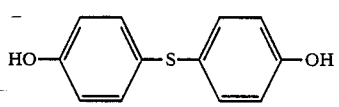 | 4,4'-Dihydroxydiphenyl sulfide |
| 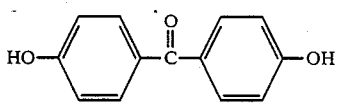 | Dihydroxybenzophenone |
| 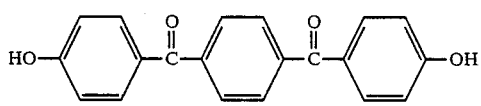 | 1,4-Di-(4'-hydroxyphenylcarbonyl)-benzene |
| 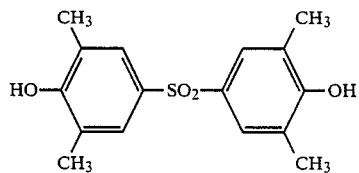 | Tetramethylbisphenol S |
| 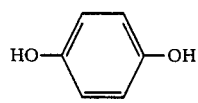 | Hydroquinone |
| 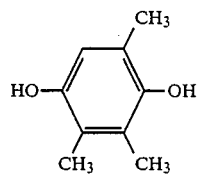 | 2,3,6-Trimethylhydroquinone |

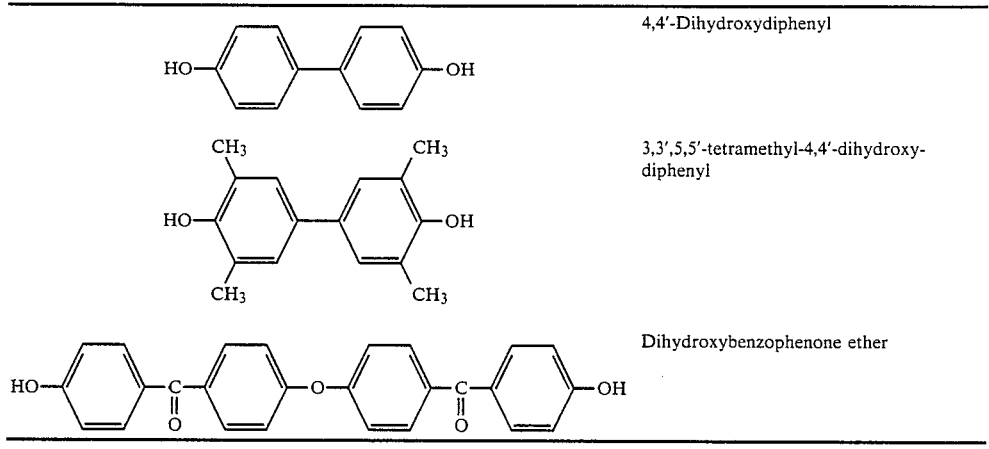

| | |
|---|---|
| | 4,4'-Dihydroxydiphenyl |
| | 3,3',5,5'-tetramethyl-4,4'-dihydroxy-diphenyl |
| | Dihydroxybenzophenone ether |

The mixture of the dihydroxy compounds A, B and, where relevant, C contains from 2 to 98 mol % of A, from 2 to 98 mol % of B and from 0 to 96 mol % of C, the percentages in each case being based on the sum of A-C.

Preferred mixtures are those which contain from 20 to 80, in particular from 25 to 70, mol % of A, from 20 to 80, in particular from 25 to 70, mol % of B and from 0 to 60, in particular from 5 to 60, mol % of C.

Component C is present in the mixture whenever component E is not used. In this case, as a rule from 5 to 60, preferably from 10 to 40, mol %, based on the sum of compounds A to C, of dihydroxy compound C are used.

The molar ratio of dihydroxy compound B to the sum of A and C is not more than 1. If this ratio is greater than 1, the water absorption is adversely affected and becomes too high. Products of this type are less suitable for the production of components in the electrical industry and electronics.

Compounds D and E, which are reacted with the mixture of compounds A, B and, if required, C to give the novel heat-stable copolycondensate molding materials, are aromatic dihalogen compounds. Compound D is 4,4'-dichloro- or 4,4'-difluorodiphenyl sulfone or their $C_1$–$C_6$-alkyl-substituted or halogen-substituted derivatives, such as 3,3,5,5'-tetramethyl-4,4'-dichlorodiphenyl sulfone or the corresponding fluorine compound. The two halogen substituents may be identical or different. v and w can be 0, 1, 2, 3 or 4, and are preferably 0, 1 or 2.

The compounds E are of the general formula

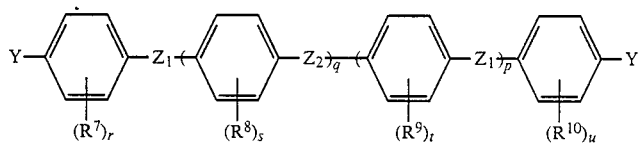

where Y is Cl or F, $Z_1$ is

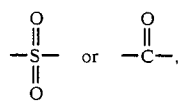

$Z_2$ is —O—, —S—,

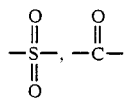

or a chemical bond, $R^7$, $R^8$, $R^9$ and $R^{10}$ are each hydrogen, Cl or F or may have the same meanings as $R^1$ and $R^2$, q and p are each 0 or 1 and r, s, t and u may each be an integer from 0 to 4.

$Z_2$ is preferably a chemical bond, or —$SO_2$—, and $R^7$, $R^8$, $R^9$ and $R^{10}$ are each preferably hydrogen, methyl, ethyl or Cl or F. r, s, t and u may each be 0, 1, 2, 3 or 4, preferably 0, 1 or 2.

Some preferred dihalogen compounds D and E are listed below merely as typical examples.

| | Name of chlorine compound |
|---|---|
| | 4,4'-Dichlorobenzophenone |
| | 1,4-Di-(4'-chlorophenylcarbonyl)-benzene |

-continued

| Structure | Name of chlorine compound |
|---|---|
| Cl.F—⌬—SO₂—⌬—⌬—SO₂—⌬—Cl.F | 1,10-Di-(4'-chlorophenylsulfonyl)-diphenyl |
| Cl.F—⌬—SO₂—⌬—Cl.F | 4,4'-Dichlorodiphenyl sulfone |
| Cl.F—⌬(CH₃)₂—SO₂—⌬(CH₃)₂—Cl.F | 3,3',5,5'-Tetramethyl-4,4'-dichlorodiphenyl sulfone |
| Cl.F—⌬(Cl)—SO₂—⌬—Cl.F | 3-Chloro-4,4'-dichlorodiphenyl sulfone |
| Cl.F—⌬(Cl)—SO₂—⌬(Cl)—Cl.F | 3,3'-4,4'-Tetrachlorodiphenyl sulfone |
| Cl.F—⌬—SO₂—⌬(CH₃)₂—SO₂—⌬—Cl.F | 1,3-Dimethyl-4,6-di-(4-chlorophenylsulfonyl)benzene |

The amount of dihalogen compound D is from 1 to 100, preferably from 20 to 100, particularly preferably from 50 to 100, mol %, based on the sum of D and E.

The dihalogen compounds E are present when no dihydroxy compound C is used. In this case, the amount of the dihalogen compound E is preferably from 5 to 50, particularly preferably from 10 to 40, mol %, based on the sum of D and E.

The novel copolycondensate molding materials can be mixed with other thermoplastics, for example polyesters, nylons, polyurethanes, polyolefins, polyvinyl chloride and polyoxymethylenes, in amounts of from 5 to 50, preferably from 20 to 50, % by weight, based on the molding materials.

They may furthermore be modified with reinforcing fillers and, if required, transparent pigments and other assistants and additives.

Examples of reinforcing fillers are asbestos, carbon and preferably glass fibers, the latter being used in the form of, for example, glass fabrics, mats, surface mats and/or preferably glass rovings or cut glass filaments of low-alkali E glasses having a diameter of from 5 to 200 μm, preferably from 8 to 15 μm, which, after being incorporated, have a mean length of from 0.05 to 1 mm, preferably from 0.1 to 0.5 mm. The molding materials reinforced with glass rovings or cut glass filaments contain from 10 to 60, preferably from 20 to 50, % by weight, based on the total weight, of the reinforcing material, while the impregnated glass fabrics, mats and/or surface mats contain from 10 to 80, preferably from 30 to 60, % by weight, based on the total weight, of copolycondensates. Examples of suitable pigments are titanium dioxide, cadmium sulfide, zinc sulfide, barium sulfate and carbon black. Examples of other suitable additives and assistants are dyes, lubricants, eg. graphite or molybdenum disulfide, abrasives, eg. carborundum, light stabilizers and stabilizers against hydrolysis. The pigments, additives and assistants are usually used in amounts of from 0.01 to 3% by weight, based on the weight of polycondensates.

Wollastonite, calcium carbonate, glass spheres, quartz powder, silicon nitride and boron nitride or mixtures of these fillers may also be used.

The polycondensation of the dihydroxy compounds A, B and, where relevant, C with the dihalogen compounds D and, where relevant, E can be carried out in principle by the processes which are known for the preparation of polysulfones or polyethersulfones and are described in the literature. A preferred process for the preparation of the novel copolycondensates is described below as a typical example.

The mixture of the aromatic dihydroxy compounds A, B and, if required, C can be reacted with aromatic dihalogen compounds in a molar ratio of from 0.8:1 to 1.2:1, preferably from 0.9:1 to 1.1:1, in particular from 0.98:1 to 1.02:1, and particularly preferably with an equimolar amount of aromatic dihalogen compounds in the presence of from 1.0 to 2.0, preferably from 1.05 to 1.5, moles of an anhydrous alkali metal carbonate, in particular $K_2CO_3$, in an aprotic, polar solvent.

Preferred aprotic polar solvents are N-substituted acid amides and lactams. N,N-dimethylformamide, N,N-dimethylacetamide and N-methylpyrrolidone may be mentioned merely by way of example.

If desired, an azeotrope former may be added to the solvent in order to remove the water of reaction. Compounds of this type are described in the literature. However, an azeotrope former may also advantageously be omitted.

The amount of monomers is in general from 20 to 80, preferably from 30 to 70, in particular from 40 to 60, % by weight, based on the total amount of the solvent.

The major part of the water of reaction formed can be removed at from 100° to 200° C., preferably from 130° to 180° C. This can be effected, for example, by heating alone, by adding an azeotrope former or, preferably, by reducing the pressure.

The condensation can then be continued at from 180° to 220° C. until the desired molecular weight or the desired degree of condensation is reached.

The total reaction time is, as a rule, from 5 to 20, preferably from 7 to 15, hours and is of course dependent on the reaction conditions (temperature and pressure) and on the desired molecular weight of the product.

After the polycondensation, the product can be reacted with an arylating or alkylating agent, eg. methyl chloride, in order to stabilize free terminal phenolate groups. This reaction is preferably carried out at from 50° to 200° C., preferably from 50° to 150° C.

The suspended alkali metal halide obtained in the polycondensation can be separated off by means of a suitable separating apparatus, for example a clarifying filter or a centrifuge.

The copolycondensate can be isolated from the solution by evaporation of the solvent or precipitation in a suitable nonsolvent.

The novel copolycondensates, particularly products prepared by the process described above, generally have a reduced viscosity of from 0.35 to 2.0, preferably from 0.45 to 1.0, in particular from 0.45 to 0.85, measured as a 1% by weight solution in 1:1 phenol/o-dichlorobenzene at 25° C.

The novel copolycondensate molding materials are distinguished by their balanced properties. They possess high heat distortion resistance and good stres cracking resistance coupled with low water absorption and very good processability.

The molding materials according to the invention can be used for the production of moldings, films and fibers. Because of their good properties, they are particularly useful for the production of circuit boards and electrical plug connections.

EXAMPLE 1V (Comparison)

86 kg of N-methylpyrrolidone, 11.41 kg (50 moles) of bisphenol A, 12.51 kg (50 moles) of 4,4'-dihydroxydiphenyl sulfone and 28.72 kg of 4,4'-dichlorodiphenyl sulfone were dissolved under a nitrogen atmosphere in a 300 l vessel provided with a stirrer and a $N_2$ connection, and 15.2 kg (150 moles) of anhydrous potassium carbonate were added.

The reaction mixture was first heated for one hour at 180° C. under 300 mbar (30 kPa) with constant removal of the water of reaction and N-methylpyrrolidone by distillation, and was kept at this temperature for 3 hours. The reaction was then continued for 6 hour at 190° C.

The polycondensation was terminated by adding methyl chloride at 150° C. and carrying out the reaction for 2 hour under pressure (0.5 bar).

After the addition of 125 kg of N-methylpyrrolidone, the inorganic components were filtered off and the polymer was isolated as a solid by precipitation in methanol. After drying at 100° C. under reduced pressure, the polymer was converted to granules.

EXAMPLE 2V (Comparison)

The procedure described in Example 1 was followed, except that 25 mol % of bisphenol A and 75 mol % of 4,4'-dihydroxydiphenyl sulfone were used.

EXAMPLE 3V (Comparison)

The procedure described in Example 1 was followed, except that a mixture of 75 mol % of bisphenol A and 25 mol % of 4,4'-dihydroxydiphenyl sulfone (DHDPS) was used.

EXAMPLE 4V (Comparison)

A 50:50 (mol %) mixture of a polysulfone and a polyethersulfone was used.

EXAMPLES 5 TO 13

The procedure described in Example 1 was followed, except that the dihydroxy compounds and dihalogen compounds stated in the Table were used.

The following abbreviations are used in the Table:

| | |
|---|---|
| Bis A | Bisphenol A |
| T-Bis A | Tetramethylbisphenol A |
| DHDPS | 4,4'-dihydroxyphenyl sulfone |
| DHDP | 4,4'-dihydroxydiphenyl |
| T-DHDP | 3,3',5,5'-tetramethyl-4,4'-dihydroxydiphenyl |
| TMH | 2,3-trimethylhydroquinone |
| DCDPS | 4,4'-dichlorodiphenyl sulfone |
| DDP | 1,10-di-(4'-chlorophenylsulfonyl)-diphenyl |
| DDB | 1,3-dimethyl-4,6-di-(4'-chlorophenyl-sulfonyl)-benzene. |

Table 1 also shows the heat distortion resistance (Tg) and the water absorption after storage under standard conditions of temperature and humidity (23° C., 50% relative humidity) and after storage in $H_2O$ at 23° C., for 180 days in each case.

TABLE

| Example | Component A (mol) | Component B (mol) | Component C (mol) | Component D (mol) | Component E (mol) | Tg °C. | Water absorption Standard conditions | $H_2O$ |
|---|---|---|---|---|---|---|---|---|
| 1V+ | Bis A (0.05) | DHDPS (0.05) | — | DCDPS (0.1) | — | 210 | 0.14 | 1.05 |
| 2V+ | Bis A | DHDPS | — | DCDPS | — | 215 | 0.21 | 1.37 |

TABLE-continued

| Example | Component A (mol) | Component B (mol) | Component C (mol) | Component D (mol) | Component E (mol) | Tg °C. | Water absorption Standard conditions | H$_2$O |
|---|---|---|---|---|---|---|---|---|
| | (0.025) | (0.075) | | (0.1) | | | | |
| 3V+ | Bis A (0.075) | DHDPS (0.025) | — | DCDPS (0.1) | — | 197 | 0.11 | 0.78 |
| 4V*+ | — | — | — | — | — | 189/224 | 0.18 | 1.15 |
| 5 | Bis A (0.025) | DHDPS (0.05) | T-Bis A (0.025) | DCDPS (0.1) | — | 252 | 0.12 | 0.89 |
| 6 | Bis A (0.025) | DHDPS (0.05) | DHDP (0.025) | DCDPS (0.1) | — | 225 | 0.12 | 0.92 |
| 7 | Bis A (0.025) | DHDPS (0.05) | T-DHDP (0.025) | DCDPS (0.025) | — | 241 | 0.10 | 0.88 |
| 8 | Bis A (0.05) | DHDPS (0.05) | — | DCDPS (0.05) | DDP (0.05) | 225 | 0.16 | 1.09 |
| 9 | Bis A (0.05) | DHDPS (0.05) | — | DCDPS (0.075) | DDP (0.025) | 245 | 0.17 | 1.11 |
| 10 | Bis A (0.05) | DHDPS (0.05) | — | DCDPS (0.05) | DDB (0.05) | 225 | 0.13 | 0.99 |
| 11 | Bis A (0.0375) | DHDPS (0.05) | TMH (0.0125) | DCDPS (0.1) | — | 215 | 0.15 | 1.10 |
| 12 | Bis A (0.025) | DHDPS (0.075) | DHDP (0.05) | DCDPS (0.1) | — | 221 | 0.13 | 1.03 |
| 13 | Bis A (0.055) | DHDPS (0.02) | T-DHDP (0.025) | DCDPS (0.1) | — | 226 | 0.10 | 0.90 |

*50:50 mixture of polysulfone and polyethersulfone
+Examples 1 to 4 are Comparative Examples

We claim:

1. A heat stable copolycondensate molding material which contains polyarylene sulfone and polyarylene ether sulfone units in random distribution and is obtainable by polycondensation of a mixture of (A) from 2 to 98 mol%, based on the sum of (A) to (C), of

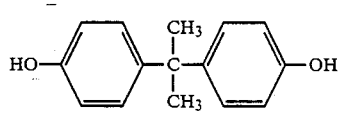

(B) from 2 to 98 mol%, based on the sum of (A) to (C), of

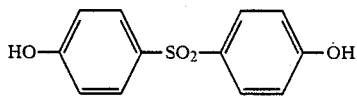

and (C) from 0 to 96 mol%, based on the sum of (A) to (C), of

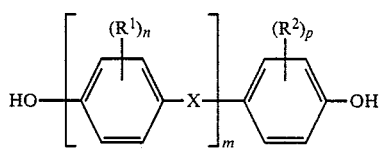

where X is a chemical bond or

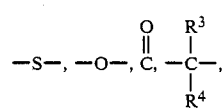

wherein $R^3$ and $R^4$ are different when n and p are simultaneously 0 or

only when n or p is not 0, $R^1$ and $R^2$ are each alkyl or alkoxy, each of 1 to 6 carbon atoms, $R^3$ and $R^4$ are each hydrogen, alkyl of 1 to 6 carbon atoms, aryl or halogen-substituted alkyl of 1 to 4 carbon atoms, m is 0 or 1 and n and p are 0, 1, 2, 3 or 4, with (D) from 1 to 100 mol%, based on the sum of (D) and (E), of

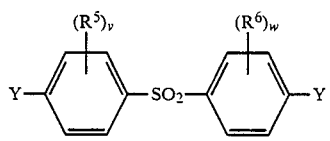

where $R^5$ and $R^6$ are each hydrogen or have the same meaning as $R^1$ and $R^2$, Y is Cl or F, and v and w are each 0, 1, 2, 3 or 4, and (E) from 0 to 99 mol%, based on the sum of (D) and (E), of

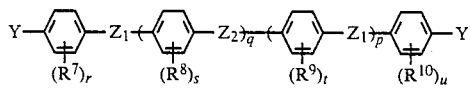

where Y is Cl or F, $Z_1$ is

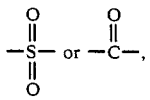

$Z_2$ is —O—, —S—

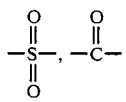

or a chemical bond, $R^7$, $R^8$, $R^9$ and $R^{10}$ are each hydrogen, Cl or F or may have the same meaning as $R^1$ and $R^2$, q and p are each 0 or 1 and r, s, t and u may each be an integer of from 0 to 4, with the proviso that one or more of the components (C) and (E) are present and the molar ratio of (B) to the sum of (A)+(C) is not greater than 1; further comprising from 10 to 60% by weight, based on the total weight, of at least one reinforcing filler.

2. A heat-stable copolycondensate molding material as claimed in claim 1, which is obtainable by polycondensation of a mixture of from 25 to 70 mol% of (A), from 25 to 70 mol% of (B) and from 5 to 60 mol% of (C), the percentages in each case being based on the sum of (A) to (C), with from 1 to 100 mol% of (D) and from 0 to 99 mol% of (E), the percentage in each case being based on the sum of (D) and (E).

3. A heat-stable copolycondensate molding material as claimed in claim 1, which is obtainable by polycondensation of a mixture of from 20 to 80 mol% of (A), from 20 to 80 mol% of (B) and from 0 to 60 mol% of (C), the percentages in each case being based on the sum of (A) to (C), with from 50 to 95 mol% of (D) and from 5 to 50 mol% of (E), the percentages in each case being based on the sum of (D) and (E).

4. A heat-stable copolycondensate molding material as claimed in claim 1, which is obtainable by polycondensation of a mixture of from 25 to 70 mol% of (A), from 25 to 70 mol% of (B) and from 5 to 60 mol% of (C), the percentages in each case being based on the sum of (A) to (C), with from 50 to 95 mol% of (D) and from 5 to 50 mol% of (E), the percentages in each case being based on the sum of (D) and (E).

5. The molding which is obtainable from a heat-stable copolycondensate molding material as claimed in claim 1 as the central component.

6. A printed circuit board consisting of a heat-stable polycondensate molding material as claimed in claim 1.

7. An electrical plug connection consisting of a heat-stable copolycondensate molding material as claimed in claim 1.

8. A heat stable copolycondensate molding material which contains polyarylene sulfone and polyarylene ether sulfone units in random distribution and is obtainable by polycondensation of a mixture of
(A) from 2 to 98 mol%, based on the sum of (A) to (C), of

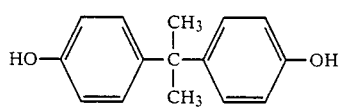

(B) from 2 to 98 mol%, based on the sum of (A) to (C), of

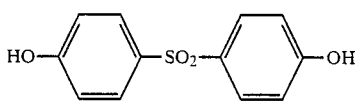

and
(C) from 0 to 96 mol%, based on the sum of (A) to (C), of

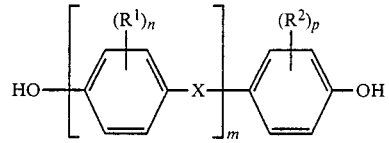

where X is a chemical bond or

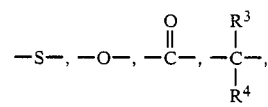

wherein $R^3$ and $R^4$ are different when n and p are simultaneously 0, or

only when u or p is 0, $R^1$ and $R^2$ are each alkyl or alkoxy, each of 1 to 6 carbon atoms, $R^3$ and $R^4$ are each hydrogen, alkyl of 1 to 6 carbon atoms, aryl or halogen-substituted alkyl of 1 to 4 carbon atoms, m is 0 or 1 and n and p are 0, 1, 2, 3 or 4, with
(D) from 1 to 100 mol%, based on the sum of (D) and (E), of

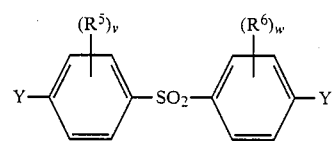

where $R^5$ and $R^6$ are each hydrogen or have the same meaning as $R^1$ and $R^2$, Y is Cl or F, and v and w are each 0, 1, 2, 3 or 4, and
(E) from 0 to 99 mol% based on the sum of (D) and (E), of

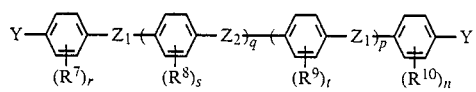

where Y is Cl or F, $Z_1$ is

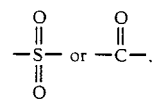

$Z_2$ is —O—, —S—,

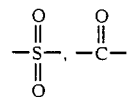

or a chemical bond, $R^7$, $R^8$, $R^9$ and $R^{10}$ are each hydrogen, Cl or F or may have the same meaning as $R^1$ and $R^2$, q and p are each 0 or 1 and r, s, t and u may each be an integer of from 0 to 4, with the proviso that one or more of the components (C) and (E) are present and the molar ratio of (B) to the sum of (A)+(C) is not greater than 1; further comprising from 5 to 50% by weight, based on the molding materials, of at least one thermoplastic selected from the group consisting of polyesters, nylons, polyurethanes, polyolefins, polyvinyl chlorides and polyoxymethylenes.

9. A heat-stable copolycondensate molding material as claimed in claim 8, which is obtainable by polycondensation of a mixture of from 25 to 70 mol% of (A), from 25 to 70 mol% of (B) and from 5 to 60 mol% of (C), the percentages in each case being based on the sum of (A) to (C), with from 1 to 100 mol% of (D) and from 0 to 99 mol% of (E), the percentage in each case being based on the sum of (D) and (E).

10. A heat-stable copolycondensate molding material as claimed in claim 8, which is obtainable by polycondensation of a mixture of from 20 to 80 mol% of (A), from 20 to 80 mol% of (B) and from 0 to 60 mol% of (C), the percentages in each case being based on the sum of (A) to (C), with from 50 to 95 mol% of (D) and from 5 to 50 mol% of (E), the percentages in each case being based on the sum of (D) and (E).

11. A heat-stable copolycondensate molding material as claimed in claim 8, which is obtainable by polycondensation of a mixture of from 25 to 70 mol% of (A), from 25 to 70 mol% of (B) and from 5 to 60 mol% of (C), the percentages in each case being based on the sum of (A) to (C), with from 50 to 95 mol% of (D) and from 5 to 50 mol% of (E), the percentage in each case being based on the sum of (D) and (E).

12. The molding which is obtainable from a heat-stable copolycondensate molding material as claimed in claim 8 as the central component.

13. A printed circuit board consisting of a heat-stable polycondensate molding material as claimed in claim 8.

14. An electrical plug connection consisting of a heat-stable copolycondensate molding material as claimed in claim 8.

15. A heat stable copolycondensate molding material as defined in claim 1, comprising from 5 to 50% by weight, based on the molding materials, of at least one thermoplastic selected from the group consisting of polyesters, nylons, polyurethanes, polyolefins, polyvinyl chlorides and polyoxymethylenes.

16. A heat stable copolycondensate molding material as defined in claim 2, comprising from 5 to 50% by weight, based on the molding materials, of at least one thermoplastic selected from the group consisting of polyesters, nylons, polyurethanes, polyolefins, polyvinyl chlorides and polyoxymethylenes.

17. A heat stable copolycondensate molding material as claimed in claim 3, comprising from 5 to 50% by weight, based on the molding materials, of at least one thermoplastic selected from the group consisting of polyesters, nylons, polyurethanes, polyolefins, polyvinyl chlorides and polyoxymethylenes.

18. A heat stable copolycondensate molding material as claimed in claim 4, comprising from 5 to 50% by weight, based on the molding materials, of at least one thermoplastic selected from the group consisting of polyesters, nylons, polyurethanes, polyolefins, polyvinyl chlorides and polyoxymethylenes.

19. The molding material of claim 1, wherein $R^1$ and $R^2$ are each independently $C_{1-4}$ alkyl or $C_{1-4}$ alkoxy, and $R^3$ and $R^4$ are each independently $C_{1-4}$ alkyl, aryl or halogen-substituted alkyl, m is 1 and n and p are each independently 0, 1, 2 or 3.

* * * * *